(12) United States Patent
Grunes et al.

(10) Patent No.: US 6,409,890 B1
(45) Date of Patent: *Jun. 25, 2002

(54) METHOD AND APPARATUS FOR FORMING A UNIFORM LAYER ON A WORKPIECE DURING SPUTTERING

(75) Inventors: Howard E. Grunes, Santa Cruz; Zheng Xu, Foster City; Praburam Gopalraja, Sunnyvale; John C. Forster, San Francisco; Ralf Hofmann, San Jose; Anantha Subramani, San Jose, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/362,917

(22) Filed: Jul. 27, 1999

(51) Int. Cl.[7] .......................... C23C 14/35; C23C 14/34
(52) U.S. Cl. ............................. 204/192.12; 204/298.11; 204/298.12; 204/298.08; 204/298.26; 204/298.06; 204/298.19
(58) Field of Search .................... 204/298.11, 298.12, 204/298.08, 298.26, 192.12, 298.066, 298.19

(56) References Cited

U.S. PATENT DOCUMENTS 3,594,301 A    7/1971   Bruch ....................... 204/298

(List continued on next page.)

FOREIGN PATENT DOCUMENTS

| EP | 0774886 | 5/1997 | |
| EP | 0807954 | 11/1997 | |
| JP | 5-263234 | * 10/1993 | ............ 204/298.12 |
| JP | 59-190363 | 10/1994 | |
| WO | 9852207 | 11/1998 | |

OTHER PUBLICATIONS

US 08/789,960 filed Jan. 30, 1997 (Atty Dkt 1643/5191).

(List continued on next page.)

*Primary Examiner*—Mark F. Huff
*Assistant Examiner*—Deborah Chacko-Davis
(74) *Attorney, Agent, or Firm*—Konrad, Raynes, Victor & Mann, LLP

(57) ABSTRACT

Embodiments include devices and methods for sputtering material onto a workpiece in a chamber which includes a plasma generation area and a target. A coil is positioned to inductively couple energy into the plasma generation area to generate a plasma. A body is positioned between the workpiece and the target to prevent an amount of target material from being sputtered onto the workpiece. The body prevents an amount of target material from being sputtered onto the workpiece. The body may act as a dark space shield and inhibit plasma formation between the body and the target. The body may also act as a physical shield to block sputtered material from accumulating on the workpiece.

48 Claims, 4 Drawing Sheets

U.S. PATENT DOCUMENTS

| | | | | |
|---|---|---|---|---|
| 4,336,118 A | | 6/1982 | Patten et al. ........... | 204/192 EC |
| 4,416,760 A | * | 11/1983 | Turner ................... | 204/298.11 |
| 4,622,121 A | | 11/1986 | Wegmann et al. .......... | 204/298 |
| 4,661,228 A | | 4/1987 | Mintz .................... | 204/192.25 |
| 4,842,703 A | | 6/1989 | Class et al. ............ | 204/192.12 |
| 4,865,712 A | | 9/1989 | Mintz .................... | 204/298 |
| 4,941,915 A | | 7/1990 | Matsuoka et al. ..... | 204/298.12 |
| 4,990,229 A | | 2/1991 | Campbell et al. ...... | 204/298.06 |
| 5,122,251 A | | 6/1992 | Campbell et al. ...... | 204/298.06 |
| 5,178,739 A | | 1/1993 | Barnes et al. .......... | 204/192.12 |
| 5,234,529 A | | 8/1993 | Johnson .................... | 156/345 |
| 5,234,560 A | | 8/1993 | Kadlec et al. .......... | 204/192.12 |
| 5,404,079 A | | 4/1995 | Ohkuni et al. .......... | 315/111.81 |
| 5,417,834 A | | 5/1995 | Latz ....................... | 204/298.11 |
| 5,429,070 A | | 7/1995 | Campbell et al. ....... | 118/723 R |
| 5,431,799 A | * | 7/1995 | Mosely et al. ......... | 204/298.11 |
| 5,464,518 A | | 11/1995 | Sieck et al. ............ | 204/192.12 |
| 5,639,357 A | * | 6/1997 | Xu .......................... | 204/298.08 |
| 5,707,498 A | | 1/1998 | Ngan .................... | 204/192.12 |

OTHER PUBLICATIONS

US 08/851,946 filed May 6, 1997 (Atty Dkt 1390.P/5491).

US 08/853,024 filed May 8, 1997 (Atty Dkt 1186.P/5464).

US 08/857,921 filed May 16, 1997 (Atty Dkt 1737/5317).

US 08/929,739 filed Sep. 15, 1997 (abandoned) (Atty Dkt 2168/5768).

US 09/049,276 filed Mar. 27, 1998 (Atty Dkt. 938.D2/5703).

US 09/049,839 filed Mar. 27, 1998 (Atty Dkt 938.D/5702).

Yamashita, M. "Sputter Type High Frequency Ion Source for Ion Beam Deposition Apparatus," Jap. J. Appl. Phys., vol. 26, No. 5, pp. 721–727, 1987.

Yamashita, M. "Fundamental Characteristics of Built–in High–frequency Coil–type Sputtering Apparatus," J. Vac. Sci. Technol., vol. A7 (2), pp. 151–158, 1989.

Rossnagel, S.M., et al. "Magnetron Sputter Deposition with High Levels of Metal Ionization," Appl. Phys. Lett., vol. 63 (24), pp. 3285–3287, 1993.

Hopwood, J., et al. "Mechanisms for highly ionized magnetron sputtering," J. Appl. Phys., vol. 78 (2), pp. 758–765, 1995.

Rossnagel, S.M. "Directional and ionized sputter deposition for microelectronics applications," Proc. of $3^{rd}$ ISSP (Tokyo), pp. 253–260, 1995.

Matsuoka, M., et al. "Dense plasma production and film deposition by new high–rate sputtering using an electric mirror," J. Vac. Sci. Technol., vol A7 (4), 2652–2657, 1989.

U.S. Patent application 08/857,719 Filed May 16, 1997 (Atty Dkt 1752/5331).

U.S. Patent application 09/064,355 Filed Apr. 22, 1998 (Atty Dkt 1901/5462).

* cited by examiner

METHOD AND APPARATUS FOR FORMING A UNIFORM LAYER ON A WORKPIECE DURING SPUTTERING

FIELD OF THE INVENTION

The present invention relates to plasma sputtering, and more particularly, to methods and devices for forming a layer of material onto a substrate during the fabrication of semiconductor devices.

BACKGROUND OF THE INVENTION

A number of semiconductor device fabrication procedures include processes in which a material is sputtered from a target onto a workpiece such as a semiconductor wafer. Material is sputtered from the target, which is appropriately biased, by the impact of ions created in the vicinity of the target. A certain proportion of the sputtered material may be ionized by a plasma such that the resulting ions can be attracted to the wafer. The wafer is mounted on a support and is usually biased to a DC potential selected to attract the sputtered, ionized material. Typically, the sputtered material is composed of positive ions and the workpiece is negatively biased.

Sputtered material has a tendency to travel in straight line paths from the target to the substrate at angles which are oblique to the surface of the substrate. As a consequence, high aspect ratio (depth to width) features such as trenches and holes on a substrate surface may not be completely filled during deposition because deposition material may build up near the top edges of the high aspect ratio feature and close off a void or cavity. To inhibit the formation of such cavities, the sputtered material can be redirected into substantially vertical paths between the target and the substrate by negatively charging the substrate and positioning appropriate vertically oriented electric fields adjacent the substrate if the sputtered material is sufficiently ionized by the plasma. However, material sputtered by a low density plasma often has an ionization degree of less than 10%, which is usually insufficient to avoid the formation of an excessive number of cavities. Accordingly, it is desirable to increase the density of the plasma to increase the ionization rate of the sputtered material in order to decrease the formation of unwanted cavities in the deposition layer.

There are a variety of known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

In many high density plasma applications, it is preferable for the chamber to be operated at a relatively high pressure so that the frequency of collisions between the plasma ions and the deposition material atoms is increased to thereby increase the time that the sputtered material remains in the high density plasma zone. However, scattering of the deposition atoms is likewise increased. This scattering of the deposition atoms typically causes the thickness of the deposition layer on the substrate to be thicker on that portion of the substrate aligned with the center of the target and thinner in the outlying regions.

It has been found that the deposition layer can be made more uniform by reducing the distance between the target and the substrate, which reduces the effect of the plasma scattering. On the other hand, in order to increase the plasma density to increase the ionization of the sputtered atoms, it has been found desirable to increase the distance between the target and the substrate. The coil which may be used to couple energy into the plasma typically encircles the space between the target and the substrate. If the target is positioned too closely to the substrate, the ionization of the plasma can be adversely affected. Thus, in order to accommodate the coil, it has often been found necessary to space the target from the substrate a certain minimum distance even though such a minimum spacing can have an adverse effect on the uniformity of the deposition.

SUMMARY

Certain embodiments of the present invention relate to improved devices and methods for sputtering depositing a layer onto a workpiece which overcome the above-mentioned limitations.

In certain embodiments a body is placed within a deposition chamber between the target and the workpiece. This body acts to control the deposition profile by inhibiting material from being sputtered from the target onto a portion of the workpiece. Other embodiments control the size and shape of the target sputtering region to yield a desired deposition profile on the workpiece.

One embodiment for sputtering material onto a workpiece in a chamber includes a plasma generation area and a target. A coil is positioned to inductively couple energy into the plasma generation area to generate and sustain a plasma. A body is positioned on or adjacent to the target to prevent an amount of target material from being sputtered onto the workpiece. In certain embodiments the target includes a center region and an outer region and the body prevents an amount of target material from the center region from being sputtered onto the workpiece. The body may act as a physical shield to block sputtered material from accumulating on the workpiece. The body may also act as a dark space shield and inhibit plasma formation between the body and the target, thus inhibiting sputtering over a portion of the target.

Other embodiments for sputtering a material onto a workpiece include a chamber having a plasma generation area and a ring-shaped target material surrounding a center mass. The center mass and ring-shaped target material are electrically isolated from one another. An energy source is provided for coupling energy into the plasma generation area to generate and sustain a plasma. Sputtering the ring-shaped target material can in certain embodiments provide for a more uniform deposition layer.

Another embodiment relates to a method for sputtering a layer onto a workpiece including sputtering at least a portion of a target and positioning a body adjacent to a central portion of the target and between the target and the workpiece to inhibit material from the central portion of the target from being deposited on the workpiece.

Yet another embodiment relates to a target structure including a ring-shaped region and a central region surrounded by the ring-shaped region. The regions are coupled together in a manner in which the ring shaped-target region is electrically isolated from the center region. In certain embodiments the central region may be electrically grounded to inhibit sputtering of material from the central region.

BRIEF DESCRIPTION OF THE DRAWINGS

Embodiments of the invention are described with reference to the accompanying drawings which, for illustrative purposes, are schematic and not drawn to scale.

DETAILED DESCRIPTION

Figure 1A:
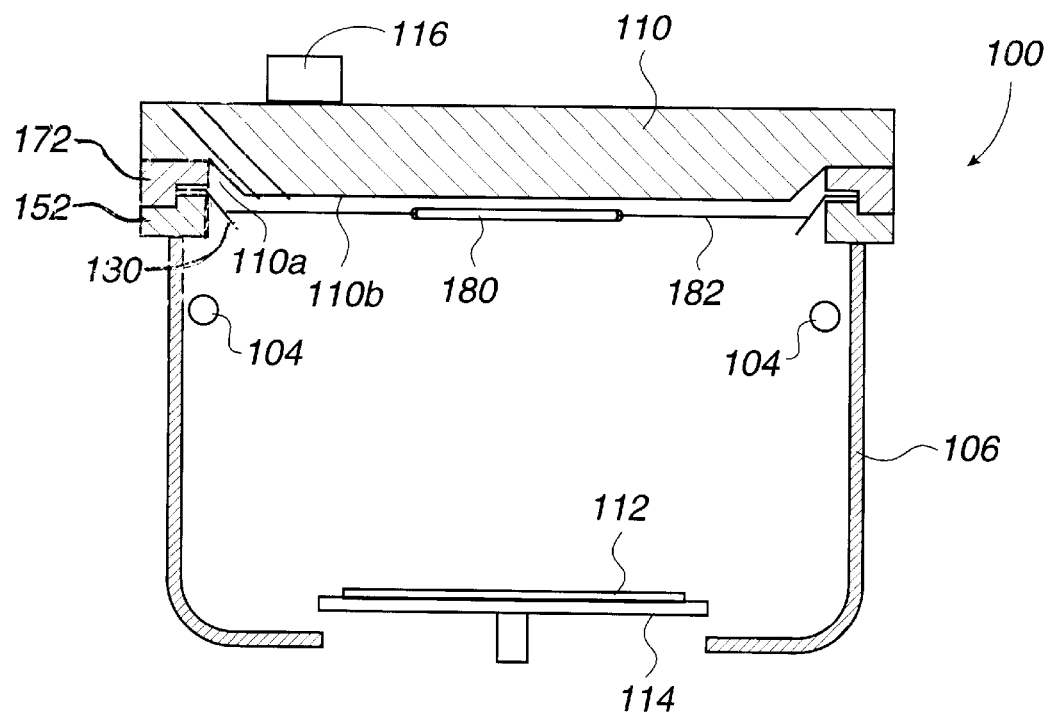
FIG. 1A is a perspective, partial cross-sectional view of a deposition chamber in accordance with one embodiment of the present invention.
Figure 1B:
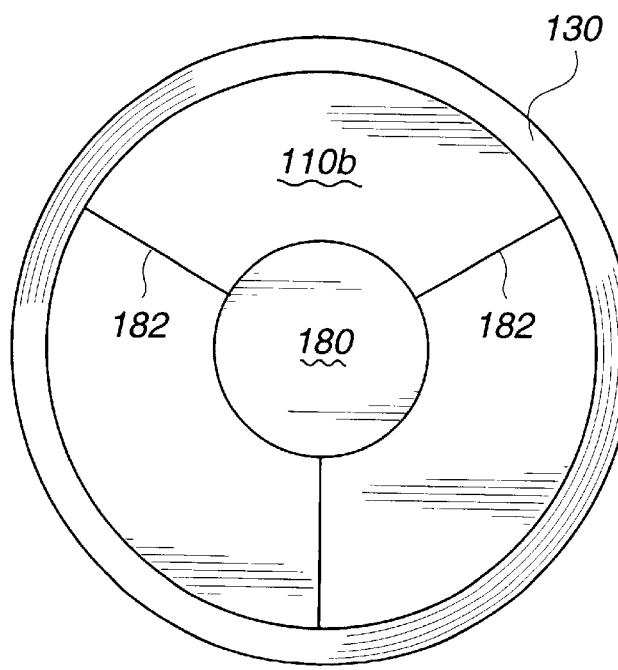
FIG. 1B is a bottom view of the target of FIG. 1A.
Figure 2:
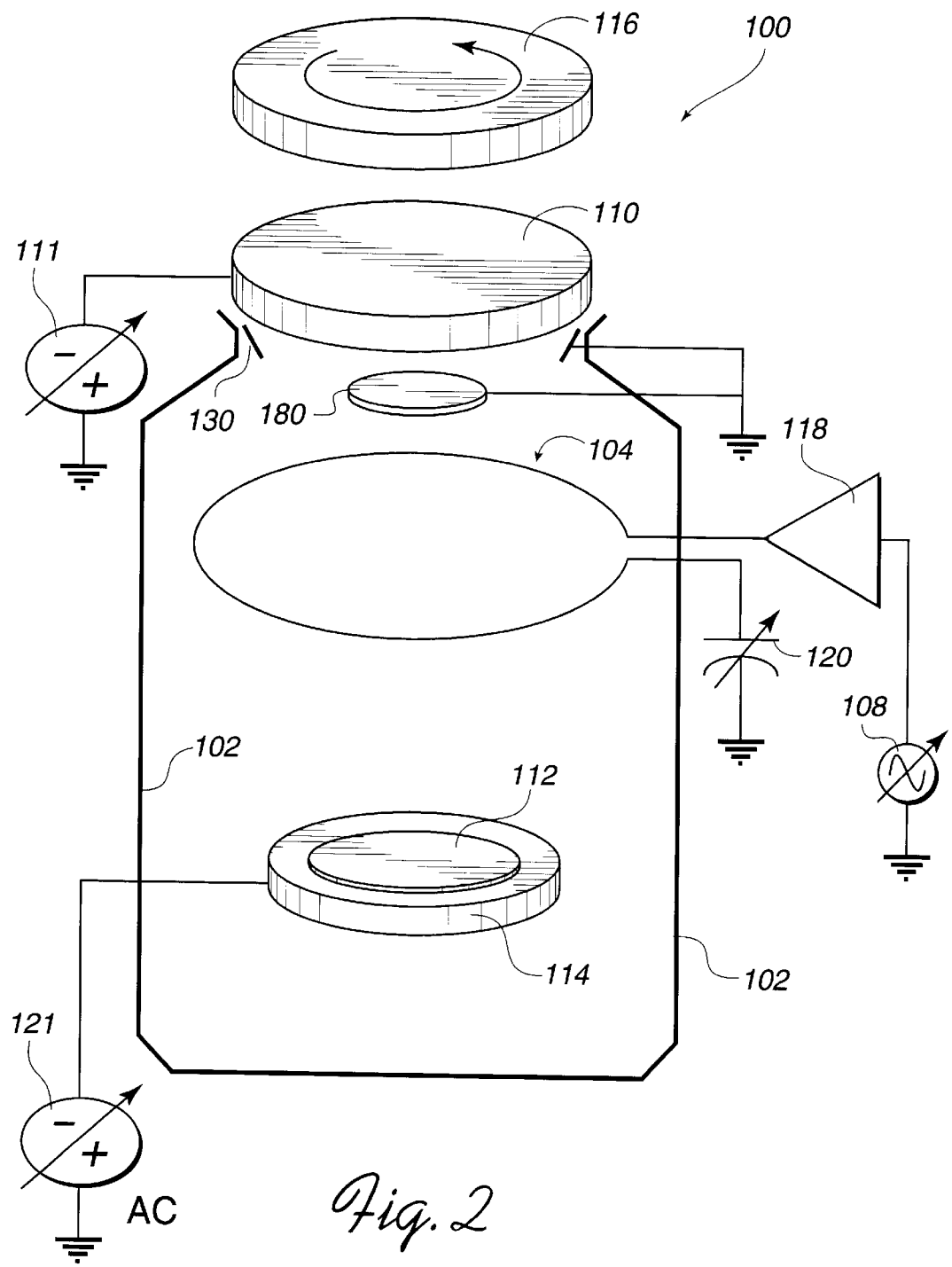
FIG. 2 is a schematic diagram of the electrical interconnections to the chamber of FIG. 2.

Referring to FIGS. 1A, 1B, and 2, a deposition in accordance with a first embodiment of the present invention comprises a substantially cylindrical plasma chamber 100 which may be received in a vacuum chamber 102 (shown schematically in FIG. 2). The plasma chamber 100 of this embodiment may utilize a coil 104 which is carried internally by a wall or shield 106 (FIG. 1A). The shield 106 may protect additional walls of the vacuum chamber 102 from the material being deposited within the interior of the plasma chamber 100.

Radio frequency (RF) energy from an RF generator 108 (FIG. 2) may be radiated from the coil 104 into the interior of the chamber 100, which energizes a plasma within the chamber 100. An ion flux strikes a target 110 positioned at the top of the chamber 100. The target 110 is preferably negatively biased by a DC power source 111 to attract an ion flux. The plasma ions eject material from the target 110 onto a substrate 112 which may be a wafer or other workpiece which is supported by a pedestal support 114 at the bottom of the chamber 100. A magnet assembly 116, preferably including a rotating magnetic device, may be provided above the target 110 to produce magnetic fields which sweep over the face of the target 110 to promote a desired erosion pattern of the face of the target 110.

The RF generator 108 is preferably coupled to the coil 104 through an amplifier and impedance matching network 118. The other end of the coil 104 is coupled to ground, preferably through a blocking capacitor 120 which may be a variable capacitor, if sputtering of the coil is desired. The ionized deposition material is attracted to the substrate 1 12 and forms a layer thereon. The pedestal 114 is preferably negatively biased by an AC (or DC or RF) source 121 to externally bias the substrate 112. Alternatively, external biasing of the substrate 112 may be eliminated.

As best seen in FIGS. 1A and 1B, the plasma chamber 100 may in certain embodiments include a dark space shield ring 130 which provides a ground plane with respect to the target 110 above which is negatively biased. The dark space shield ring 130 shields the outer edges of the target from the plasma to reduce sputtering of the target outer 110a edges. As a consequence, sputtering of the target 110 is primarily restricted to target face 110b surrounded by the shield 130.

The dark space shield 130 may be a closed continuous ring of titanium (where titanium deposition is occurring in the chamber 100) or other material such as stainless steel and may have a generally inverted frusto-conical shape. Alternatively, the dark space shield 130 may include a slot to reduce eddy currents. The dark space shield may in certain embodiments extend inward toward the center of plasma chamber 100 so as to overlap the coil 104 by a distance (for example, approximately ¼ inch). By overlapping the coil 104, the dark space shield 130 can reduce the amount of material that would otherwise be deposited on the coil (and its supporting structures) and reduce the likelihood of undesirable particles flaking off the coil. The amount of overlap can be varied depending upon the relative size and placement of the coil and other factors. For example, the overlap may be increased to increase the shielding of the coil 104 from the sputtered material but increasing the overlap could also further shield the target from the plasma, which may be undesirable in some applications. In an alternative embodiment, the coil 104 may be placed in a recessed coil chamber region positioned to further protect the coil and reduce particle deposits on the workpiece.

The chamber shield 106 may be generally bowl-shaped and include a generally cylindrically shaped, vertically oriented wall to which standoffs are attached to insulatively support the coil 104. The shield 106 may further include a generally annular-shaped floor wall which surrounds the chuck or pedestal 114 which supports the workpiece 112 which may, for example, be a wafer having an 8 inch diameter. A clamp ring may be used to clamp the workpiece to the chuck 114 and cover the gap between the floor wall of the shield 106 and the chuck 114. The chamber shield 106 may be grounded to the system ground through an adapter ring assembly 152. The dark space shield 130, like the chamber shield 106, may be grounded through the adapter ring assembly 152.

The target 110 may be generally disk-shaped and supported by the adapter ring assembly 152. However, the target 110 is preferably negatively biased and therefore should be insulated from the adapter ring assembly 152, which is preferably at ground. In certain embodiments, seated in a circular channel formed in the underside of the target 110, is an insulation ring assembly 172 which is also seated in a corresponding channel in the upper side of the adapter ring assembly 152. The insulation ring assembly 172, which may be made of a variety of insulative materials (for example, ceramics), spaces the target 110 from the adapter ring assembly 152 so that the target 110 may be adequately negatively biased. The target 110, adapter ring assembly 152 and insulation ring assembly 172 may be provided with O-ring sealing surfaces to provide a vacuum tight assembly within the chamber.

The coil 104 may be carried on the shield 106 by a plurality of coil standoffs which electrically insulate the coil 104 from the shield 106 (which is typically at ground). RF power may be applied to the coil 104 by feedthroughs which are supported by insulating feedthrough standoffs.

As previously mentioned, in order to accommodate the coil 104 to facilitate ionization of the plasma, it has been found beneficial to space the target 110 from the surface of the workpiece 112. However, this increased spacing between the target and the workpiece can adversely impact the uniformity of the material being deposited from the target. Such nonuniformity typically exhibits itself as a thickening of the deposited material toward the center of the workpiece with a consequent thinning of the deposited material toward the edges of the workpiece.

In accordance with one feature of certain embodiments of the present invention, this nonuniformity can be compensated by positioning a body within the chamber adjacent to the target. Depending on the target shape and desired effect, the body may have a variety of shapes and sizes. Certain embodiments use a disk shaped body having about one half the diameter of the target. FIGS. 1A and 1B illustrate a body shaped as a disk 180. Depending on the spacing between the disk 180 and the target 110, the disk 180 may act as a dark space shield and inhibit the formation of a plasma over a portion of the target 110, thus minimizing the sputtering taking place over that portion of the target 110. The disk 180 may also act a physical barrier to block an amount of sputtered material from reaching the workpiece 112.

As illustrated in FIGS. 1A and 1B, the disk 180 may be positioned using a plurality of wires or other supports (indicated as dashed lines 182) extending from the dark space shield 130. Preferably three wires 182 are used. Alternatively, the disk 180 could be hung from the target 110 or attached to other structure in the chamber. As shown, the disk 180 is centered relative to the target sputtering face 110b. However, the disk 180 may be positioned offset from center, depending upon the particular application. Furthermore, more than one disk or other body 180 may be distributed over the sputtering face to achieve the desired result.

In the embodiment shown in FIGS. 1A and 1B, the disk 180 is electrically grounded to the dark space shield 130. When the disk 180 is spaced a close distance from the target 110, the disk 180 can function as a dark space shield and inhibit sputtering from the portion of the target 110 adjacent to the disk 180. In certain embodiments, a spacing of approximately 1 mm between the disk 180 and target 110 is believed sufficient to have the disk 180 act as a dark space shield. In general, the greater the plasma pressure, the smaller the spacing to achieve a dark space shielding effect. It is believed that for plasma pressures between a few milliTorr and 30 milliTorr, a spacing of 1 mm will be suitable for many applications as noted above.

The disk 180 may alternatively be spaced a sufficient distance from the target (for example, approximately 10–30 mm or greater), so that the disk 180 does not operate as a dark space shield. In such embodiments the disk 180 will act as a physical barrier on which sputtered material from the target 110 will accumulate. When positioned adjacent to the center of the target 110, the disk 180 prevents a significant amount of sputtered material from accumulating on the center of the workpiece 112. In certain embodiments, the disk 180 may act as a dark space shield and a barrier.

The disk 180 is preferably made from or coated with the same material as the target. Depending on the amount of sputtered material that is desired to be prevented from accumulating on the workpiece 112, the disk 180 may be a variety of sizes and shapes. The disk 180 may have a continuous surface or may have one or more openings therein to permit an amount of sputtered material to pass through. In certain embodiments the openings may vary in size up to approximately 50–75 mm or more in diameter and may be positioned to achieve the desired effect. The disk 180 may also act to prevent contaminant particles from accumulating on the workpiece after the sputtering step is completed by blocking flakes that might otherwise fall onto the workpiece.

Figure 3A:
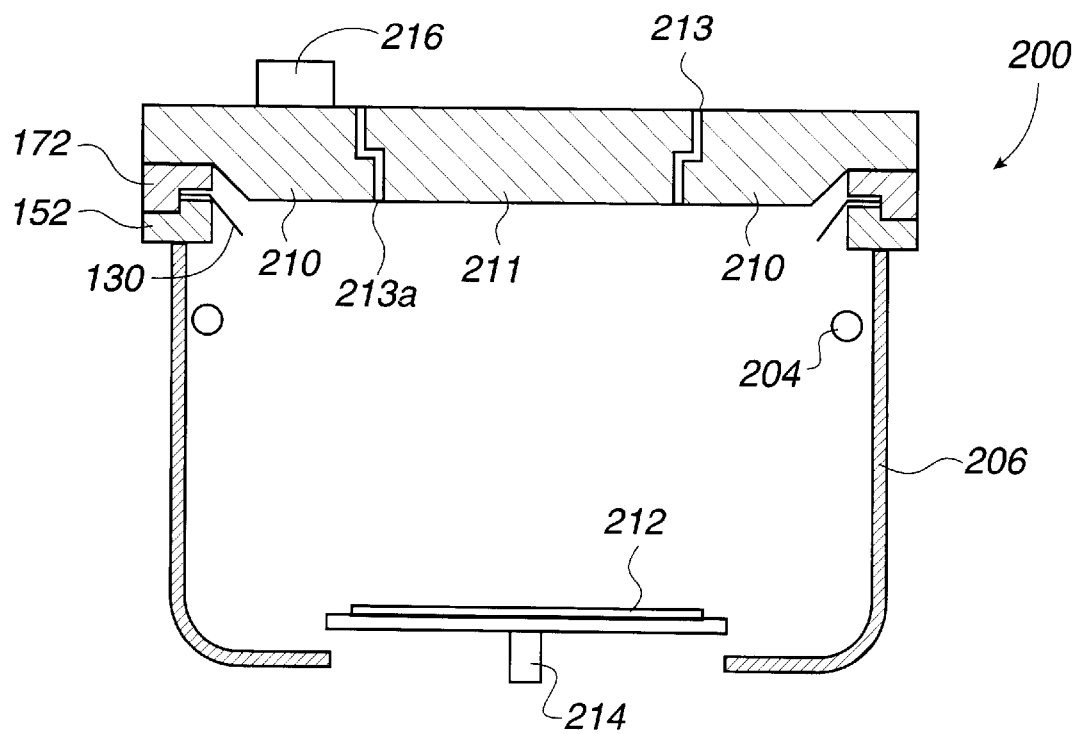
FIG. 3A is a schematic partial cross-sectional view of a deposition chamber in accordance with another embodiment of the present invention.
Figure 3B:
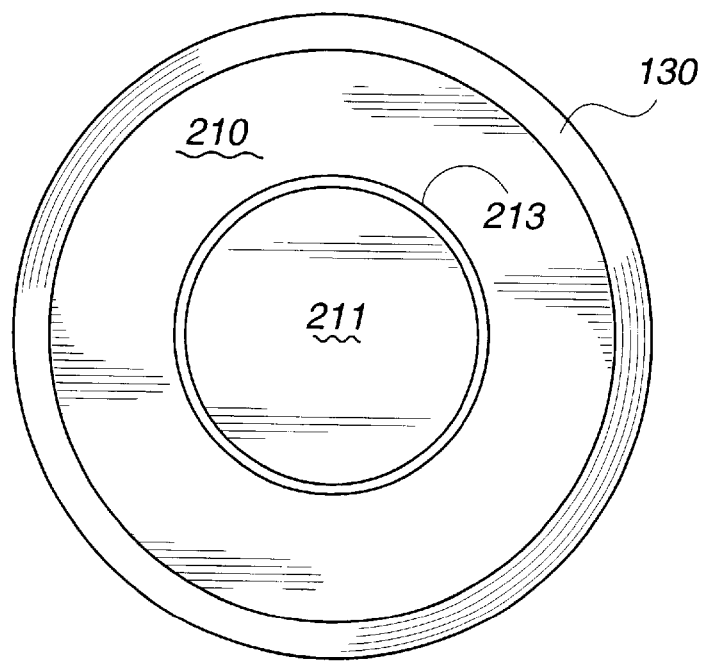
FIG. 3B is a bottom view of the target of FIG. 3A.

The embodiment illustrated in FIGS. 3A and 3B shows a chamber 200 that is similar to that illustrated in FIG. 1 in certain respects. The chamber 200 may have the same general shape as the chamber illustrated in FIGS. 1A and 1B, and may include a shield 206 on which a coil 204 is mounted and pedestal 214. The embodiment illustrated in FIGS. 3A and 3B inhibits the build-up of deposited material in the center of the workpiece 212 by using a ring-shaped target region 210 surrounding a center region 211 that is electrically insulated from the ring-shaped target region 210 by a ring 213 of insulative, high-temperature resistant material such as ceramic. A magnet assembly, preferably a magnetron 216 which includes a rotating magnetic assembly, may be provided above the ring-shaped target region 210 to produce magnetic fields which sweep over the face of the ring-shaped target region 210 to promote a desired erosion pattern. The center region 211 electrically insulated from the surrounding ring-shaped target region 212 is preferably grounded and will preferably not be sputtered. Alternatively, the center region 211 may be biased at a lower power level than the ring-shaped region 212 such that the center region sputters at a lower rate. Thus, the sputtered material will be generated primarily or even entirely by the ring shaped target region 210 and because there is relatively little or no sputtering occurring directly above the center of the workpiece 212, there will be less accumulation of sputtered material on the center of the workpiece 212.

In addition, the ring-shaped target region 210, insulative ring member 213 and electrically isolated central region 211 may be provided sufficient structural integrity to act as at least part of a lid or wall for the pressure chamber 200. Also, the internal exposed end 213a of the insulative ring member 213 may have openings or other labyrinthian structures to inhibit formation of a continuous deposition of conductive sputtered material that could bridge and thus short the center region 211 and the outer region 210 together.

The size, number, positions and shapes of the target region 212 and isolated region 211 may be varied depending on the amount of material that is desired to be sputtered and the desired deposition distribution. By controlling such variables as the ring width, the pressure, and the power applied to the coil and the target region, improved deposition profiles can be achieved.

Figure 4:
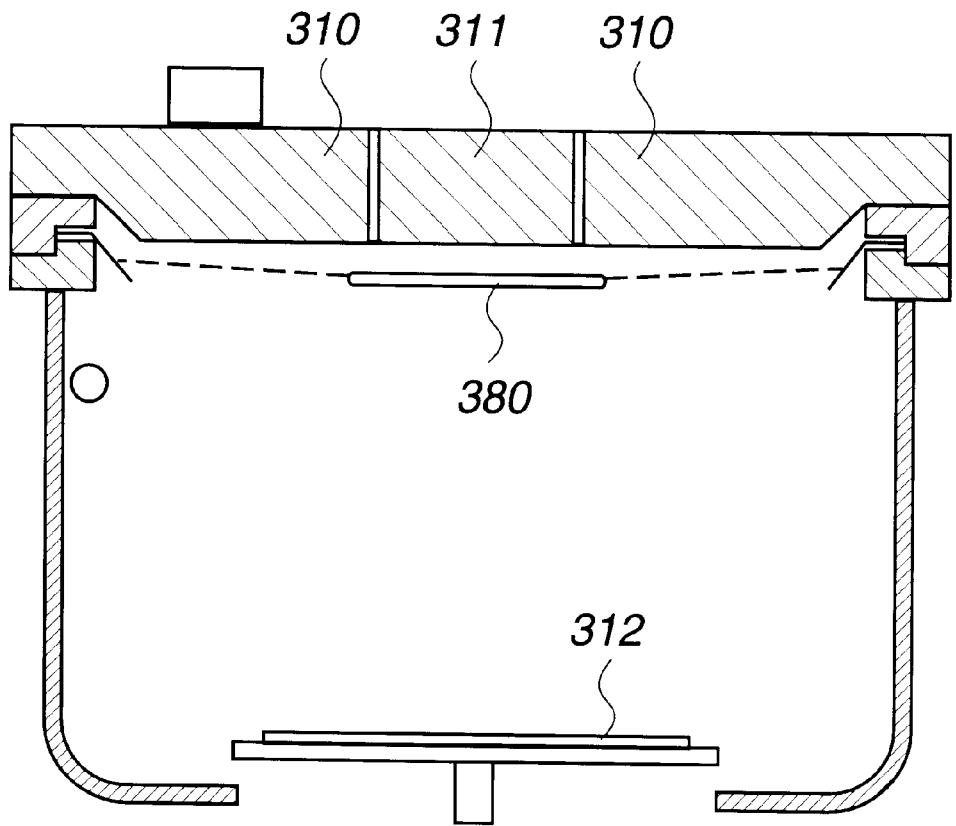
FIG. 4 is a schematic partial cross-sectional view of a deposition chamber in accordance with another embodiment of the present invention.

Alternative embodiments may utilize both a ring-shaped target region and a body similar to those described in the embodiments above. For example, the embodiment illustrated in FIG. 4 includes a ring-shaped target region 310, center region 311 and body 380 for inhibiting an amount of material from accumulating on the center of the workpiece 312. Such an embodiment may be used where material sputtered from the ring-shaped region accumulates more in the center of the workpiece than at its more peripheral regions.

For embodiments utilizing an RF coil, appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary from, for example, 1 MHz to 100 MHz. An RF power setting of 4.5 kW is preferred for a 300 mm wafer size and 2.75 kW is preferred for a 200 mm wafer size but a range of 1.55 kW is believed to be satisfactory. In some applications, energy may also be transferred to the plasma by applying AC or DC power to coils and other energy transfer members. A DC power setting for biasing the target 110 of 3 kW is preferred but a range of 2–5 kW and a pedestal bias voltage of −30 volts DC is believed to be satisfactory for many applications.

A variety of precursor gases may be utilized to generate the plasma including, for example, Ar, $H_2$, or reactive gases such as $NF_3$ and $CF_4$. Various precursor gas pressures are suitable including, for example, pressures of 0.1–50 mTorr. For ionized PVD, a pressure between 10 and 100 mTorr is preferred for best ionization of sputtered material.

Embodiments of the present invention permit the formation of uniform deposition layers while sputtering at a high pressure. The high pressure increases the ionization rate of the sputtered material and reduces the formation of unwanted voids in the deposition layer.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. For example, a variety of methods and devices for supplying energy to a chamber for plasma processing may be utilized in addition to those described above. Such methods may include, for example, capacitive coupling and wave heating. A variety of chamber shapes and sizes may also be utilized. As such, the scope of the invention should not be limited by the particular embodiments described herein but should be defined by the appended claims and equivalents thereof.

What is claimed is:

1. An apparatus for sputtering material onto a workpiece in a chamber, comprising:
    a plasma generation area in said chamber;
    a workpiece support structure adapted to support a workpiece in said chamber;
    a target positioned in said chamber, said target including a center region;
    a coil positioned to inductively couple energy into said plasma generation area to generate and sustain a plasma in at least a portion of said plasma generation area; and
    a body positioned between said target and said workpiece support structure to prevent an amount of target material from being sputtered onto said workpiece, said body being positioned a distance from said target so that said body forms a dark space shield between at least a portion of said center region and said body.

2. An apparatus as in claim 1, wherein said body is spaced approximately 1 mm from said target.

3. An apparatus as in claim 1, wherein said target includes a target sputtering surface, said body includes a body surface that faces said target sputtering surface, and said target sputtering surface has a larger surface area than said body surface.

4. An apparatus as in claim 1, wherein said target includes a target sputtering surface and said target sputtering surface is ring-shaped.

5. An apparatus as in claim 1, wherein said body includes at least one opening through which sputtered material may pass.

6. An apparatus as in claim 5, wherein said opening is approximately 50–80 mm in diameter.

7. An apparatus as in claim 1, wherein said body comprises a disk.

8. An apparatus as in claim 7, wherein said target includes a sputtering surface having a first diameter and said body has a second diameter, wherein said first diameter is approximately two times said second diameter.

9. An apparatus as in claim 1, wherein said target comprises an inner region and an outer region, and further comprising an additional dark space shield disposed adjacent to a portion of said outer region.

10. An apparatus as in claim 9, wherein said body is connected to said additional dark space shield.

11. An apparatus as in claim 1, wherein said body is impervious to sputtered material.

12. An apparatus as in claim 1, wherein said body comprises a disk having no openings therein.

13. An apparatus for sputter depositing material onto a workpiece, the apparatus comprising:
    a chamber having a target, a plasma generation area, an energy source adapted to transmit energy into said plasma generation area, and a workpiece support structure;
    said target including a center region and an outer edge;
    a first dark space shield disposed adjacent to a portion of said target to reduce sputtering of said outer edge; and
    a second dark space shield disposed adjacent to said target to inhibit the deposition of material from said center region onto said workpiece during sputtering.

14. An apparatus as in claim 13, further a coil disposed in said chamber through which energy is transmitted to said plasma generation area.

15. An apparatus for sputtering material onto a workpiece in a chamber, comprising:
    a plasma generation area in said chamber;
    a center mass;
    a ring-shaped target member surrounding said center mass, said ring-shaped target member having a flat sputtering surface, said center mass and ring-shaped target member being electrically isolated from one another; and
    an energy source adapted to couple energy into said plasma generation area to generate and sustain a plasma in at least a portion of said plasma generation area.

16. An apparatus as in claim 15, wherein said ring-shaped target member and electrically isolated center mass comprise a wall of said chamber.

17. An apparatus as in claim 15, wherein said chamber includes a lid comprising said ring-shaped target member and said electrically isolated center mass.

18. An apparatus as in claim 15, further comprising a workpiece support and a body positioned between said workpiece support and said target to prevent an amount of target material from being sputtered onto said workpiece.

19. An apparatus as in claim 15, wherein said flat sputtering surface is substantially parallel to an upper surface of said workpiece.

20. An apparatus as in claim 15, further comprising a workpiece support adapted to support said workpiece, wherein said flat sputtering surface and said workpiece support are located at opposite ends of said chamber.

21. An apparatus as in claim 15, wherein at least a portion of said flat sputtering surface directly faces said workpiece.

22. An apparatus as in claim 15, wherein said center mass is electrically grounded.

23. An apparatus for sputter depositing a layer onto a workpiece, comprising:
    a chamber including a plasma generation area and a target, said target including a center region;
    means for supplying energy to said chamber to generate and sustain a plasma in at least a portion of said plasma generation area; and
    dark space shield means for inhibiting the sputtering of target material from at least a portion of said center region of said target during sputtering of said target.

24. An apparatus as in claim 23, wherein said target further comprises an outer edge region, said apparatus further comprising an additional dark space shield means for inhibiting the sputter of target material from at least a portion of said outer edge region during sputtering of said target.

25. A method for sputtering a layer onto a workpiece in a chamber comprising:
   positioning a body adjacent a central portion of a target and between said central portion of said target and said workpiece so that said central portion of said target is at least partially blocked from said workpiece by said body, said target having a flat sputtering surface, said body having a width smaller than that of said target so that an outer portion of said flat sputtering surface is not blocked from said workpiece by said body;
   electrically grounding said body;
   said body including a surface extending in a direction substantially parallel to said flat sputtering surface of said target;
   transmitting energy to said chamber through a coil;
   sputtering at least a portion of said outer portion of said flat sputtering surface of said target;
   wherein said body inhibits material from said central portion of said target from being deposited on said workpiece; and
   depositing a uniform layer of material from said target on said workpiece.

26. A method as in claim 25, wherein said body is positioned to act as a physical barrier to block sputtered material from accumulating on said workpiece.

27. A method as in claim 25, wherein said body is disk-shaped.

28. A method as in claim 25, wherein said body is disk-shaped and has a diameter that is approximately one half that of said target.

29. A method as in claim 25, further comprising positioning said body approximately 10 to approximately 30 mm from said target.

30. A method as in claim 25, wherein said body is impervious to sputtered material.

31. A method as in claim 25, wherein said body comprises a disk having no openings therein.

32. A method as in claim 25, wherein said body is centered relative to at least one of the target flat sputtering surface and said workpiece, and wherein said body is impervious to sputtered material.

33. A method for sputtering a layer onto a workpiece in a chamber comprising:
   positioning a body adjacent a central portion of a target and between said central portion of said target and said workpiece so that said central portion of said target is at least partially blocked from said workpiece by said body, said target having a flat sputtering surface, said body having a width smaller than that of said target so that an outer portion of said flat sputtering surface is not blocked from said workpiece by said body;
   wherein said body is positioned to act as a dark space shield so that sputtering from said central portion of said target is inhibited;
   said body including a surface extending in a direction substantially parallel to said flat sputtering surface of said target;
   transmitting energy to said chamber through a coil;
   sputtering at least a portion of said outer portion of said flat sputtering surface of said target;
   wherein said body inhibits material from said central portion of said target from being deposited on said workpiece;and
   depositing a uniform layer of material from said target on said workpiece.

34. A method as in claim 33, wherein said body is positioned approximately 1 mm from said target.

35. A method for sputtering a layer onto a workpiece in a chamber comprising:
   positioning a dark space shield adjacent to a central region of a target; and
   sputtering at least a portion of said target;
   wherein said dark space shield inhibits material from being sputtered from at least a portion of said central region of said target.

36. A method as in claim 35, said body being shaped to include at least one opening therein.

37. A method as in claim 35, further comprising positioning an additional dark space shield adjacent to an edge region of said target, wherein said additional dark space shield inhibits material from being sputtered from said edge region of said target.

38. A method for forming a layer of sputtered material on a workpiece comprising:
   providing a mass above a workpiece in a chamber;
   surrounding said mass with a ring-shaped target;
   electrically isolating said ring-shaped target from said mass; and
   sputtering said ring-shaped target to form a layer of material on said workpiece.

39. A method as in claim 38, wherein said center mass is held at a ground potential for at least a portion of a time period during which said ring-shaped target is being sputtered.

40. A sputtering target structure comprising:
   a ring-shaped region;
   a central region surrounded by said ring-shaped region;
   said ring-shaped region being electrically isolated from said central region; and
   said ring-shaped region and central region being physically coupled together.

41. A target structure as in claim 40, wherein said ring shaped region and said central region comprise electrically conducting materials.

42. A target structure as in claim 40, wherein said central region is electrically grounded.

43. A target structure as in claim 40, wherein said ring-shaped target region and central region comprise a wall of a pressure vessel.

44. A target structure as in claim 40, wherein said coupled together ring-shaped target region and central region comprise at least a portion of a lid of a sputtering chamber.

45. A target as in claim 40, wherein said ring-shaped region and central region are separated by an electrically insulating material.

46. A target as in claim 40, wherein said ring-shaped region includes a continuous sputtering surface.

47. An apparatus as in claim 15, wherein said ring shaped target member is biased at a first power level and said center mass is biased as a second power level, wherein said second power level is lower than said first power level.

48. A method for sputtering a layer onto a workpiece in a chamber comprising:
   positioning a body adjacent a central portion of a target and between said central portion of said target and said workpiece so that said central portion of said target is at least partially blocked from said workpiece by said body, said target having a flat sputtering surface, said body having a width smaller than that of said target so that an outer portion of said flat sputtering surface is not blocked from said workpiece by said body;

said body including a surface extending in a direction substantially parallel to said flat sputtering surface of said target;

transmitting energy to said chamber through a coil;

sputtering at least a portion of said outer portion of said flat sputtering surface of said target;

wherein said body inhibits material from said central portion of said target from being deposited on said workpiece;

wherein said body includes at least one opening therein; and depositing a uniform layer of material from said target on said workpiece.

* * * * *